United States Patent [19]

Courtiol

[11] 4,131,012
[45] Dec. 26, 1978

[54] DEVICE FOR DETECTING IMPACTS ON A TARGET

[75] Inventor: Bernard Courtiol, Grenoble, France

[73] Assignee: CGEE Alsthom, Levallois-Perret, France

[21] Appl. No.: 876,802

[22] Filed: Feb. 10, 1978

[30] Foreign Application Priority Data

Feb. 22, 1977 [FR] France .................. 77 05156

[51] Int. Cl.² .......................................... G01L 5/14
[52] U.S. Cl. ........................................ 73/167; 73/11
[58] Field of Search ................. 73/11, 167, 649, 658, 73/610, 609, 570

[56] References Cited

U.S. PATENT DOCUMENTS

| | | | |
|---|---|---|---|
| 3,447,077 | 5/1969 | Loxley et al. | 73/167 X |
| 3,936,822 | 2/1976 | Hirschberg | 73/658 X |

*Primary Examiner*—Jerry W. Myracle
*Attorney, Agent, or Firm*—Sughrue, Rothwell, Mion, Zinn and Macpeak

[57] ABSTRACT

A device for detecting impacts on a target, comprising a vibration sensor which supplies a signal which is amplified, high-pass filtered, squared and integrated, the integration being controlled by a threshold detector. Application to a shooting range.

6 Claims, 2 Drawing Figures

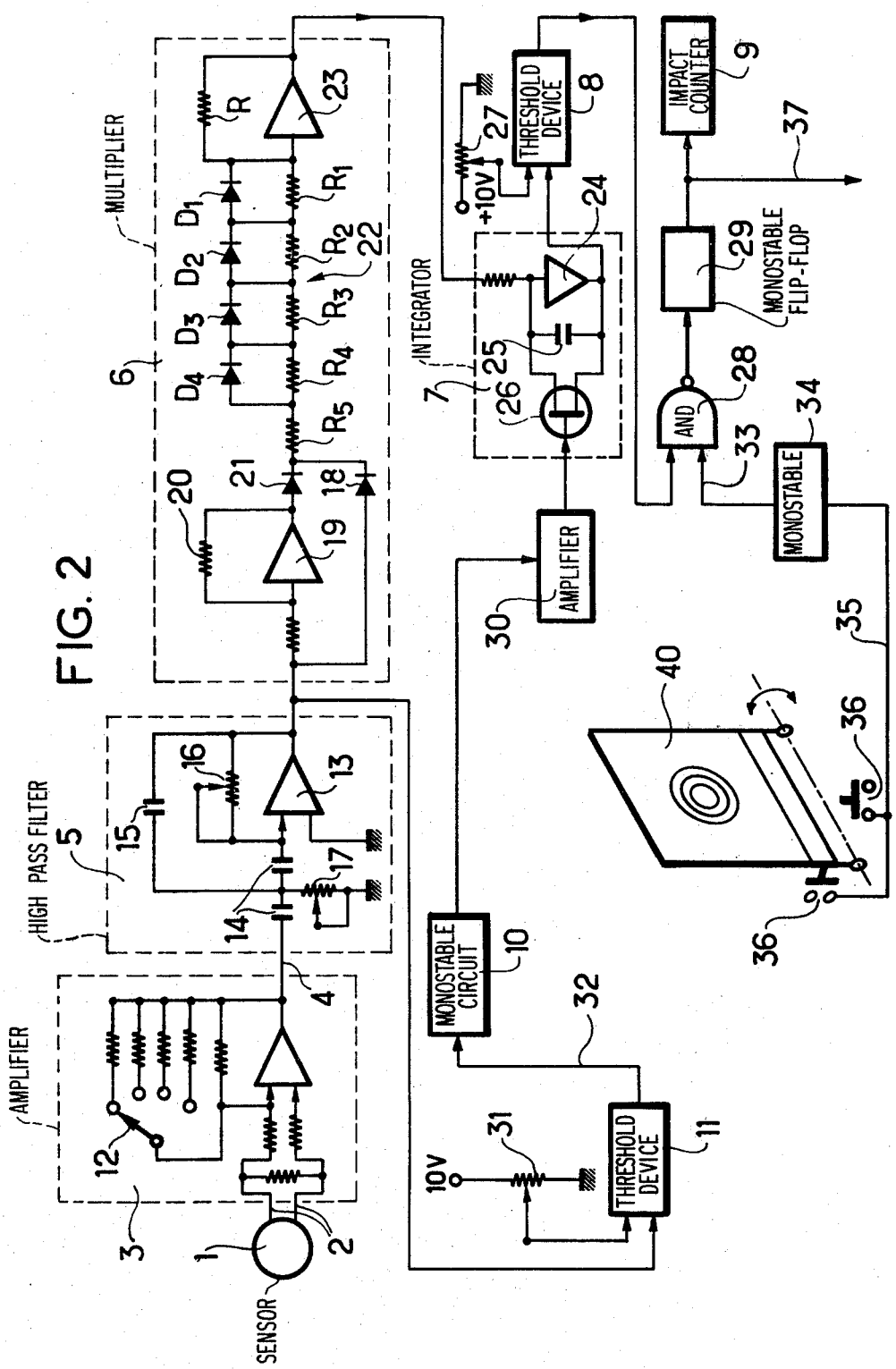

DEVICE FOR DETECTING IMPACTS ON A TARGET

FIELD OF THE INVENTION

The invention relates to a device for detecting a quantity of energy striking a solid body. It is particularly, but not exclusively concerned with the detection of impacts striking a target in a shooting range e.g. for training. It is this application of the invention which is described below.

BACKGROUND OF THE INVENTION

It has already been proposed to install on the target a sensor of the mechanical vibrations to which the target is subjected when it is struck by a projectile, so as to obtain an electric signal which, after passing through an amplifier and a threshold device, operates a flip-flop connected to a counter. Hits on the target are distinguished from projectiles passing near the target, by means of a threshold device which only allows vibrations which have an amplitude greater than a given limit to affect the counter. But practice shows that this distinction is illusory since a projectile which glances on the target sometimes produces a vibration whose amplitude is greater than that of a vibration due to a direct hit on the target.

It has been observed, other things being equal, that impacts on a target produce vibrations with higher frequencies than the simple passage of projectiles close by. Some known devices have therefore been improved by inserting a high-pass filter in the sensor circuit.

However, the applicant has observed that it is not possible to discriminate satisfactorily between direct hits on the target and near misses of the target using only the amplitude characteristic in a frequency band of the signal coming from a vibration sensor. In order to detect hits with a very small proportion of errors, it has been found that the energy in a high frequency band of the signal given by the vibration sensor must be calculated.

SUMMARY OF THE INVENTION

The present invention thus proposes firstly the installation after amplification of the electric signal, of a high-pass filter (the pass limit of the filter depends on the material of the target and can be about 10 kHz for gaboon plywood), followed by a multiplier connected as a squaring circuit, followed by a controlled integrator, followed by a threshold detector. The integrator is controlled in order to integrate only during the vibration damping time of the target.

With this invention, the threshold considered is thus an energy threshold in a frequency band and not an amplitude threshold in a frequency band, thereby enabling excellent discrimination to be obtained between vibrations due to hits and vibrations due to near misses.

The present invention therefore provides a device for detecting a quantity of energy striking a solid body, the device comprising at least one sensor transforming the mechanical vibrations to which the body is subjected into an electrical signal and, in series, an amplifier receiving this signal, a high-pass filter, a multiplier, an integrator with a controlled mode of operation, a threshold detector and a monostable pulse shaping circuit, the operation of the integrator being controlled by a circuit comprising a threshold device detecting the peaks of the electric signal, followed by a monostable device whose logic output signal drives said integrator.

An embodiment of the invention is described by way of example with reference to the accompanying drawings.

BRIEF DESCRIPTION OF THE DRAWINGS

FIG. 2 shows a detailed diagram of such a device.

DESCRIPTION OF THE PREFERRED EMBODIMENT

Figure 1:
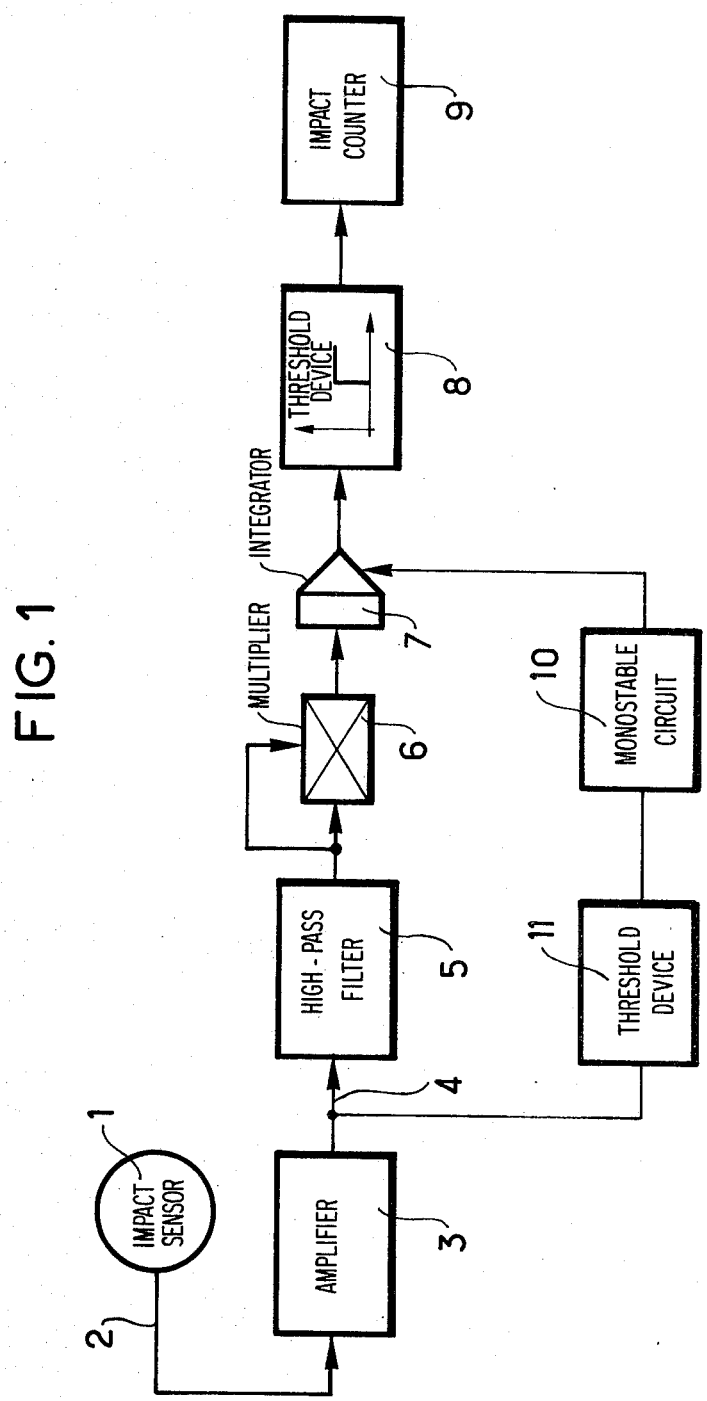
FIG. 1 shows a block diagram of a counting device comprising all the above-mentioned improvements.

In FIG. 1, a sensor 1, which can be of any type having good sensitivity to ultrasonic vibrations (for example with a piezo-electric unit), is disposed on a target, not shown, and can be either completely installed on the target or can have only some components on the target e.g. mechanical components.

This sensor 1 produces an electrical signal which is an image of the vibrations of the target and which is transmitted by a connection 2 to an amplifier 3 at the output 4 of which the electrical signal passes through a second or higher order high-pass filter 5. The transfer function of this filter can have the form:

$$p^2/(\tau^2 p^2 + 2\xi\tau p + 1)$$

where p is the laplace operator, $\tau$ is less than or equal to one millisecond and $\xi$ is equal to about 0.5. It is possible to use a single filter or several filters in series.

After the filter 5, the electrical signal is squared in a multiplier 6, then integrated during a period of about 50 ms in an integrator 7, after which it passes into a threshold device 8 which supplies a signal when some predetermined value is exceeded that is then sent to an impact counter 9.

The integrator 7 has its mode of operation defined by a monostable circuit of flip flop 10. This monostable circuit changes to its unstable state for about 50 ms after each pulse supplied by a threshold device or comparator 11. During this unstable state, the integrator 7 can integrate the output signal of the multiplier 6. This threshold device 11 delivers a signal when the amplitude of the vibration of the target is sufficiently high for it to be possible that there has been an impact. The stable state of the monostable circuit 10 blocks the integrator 7 at a zero output voltage.

In FIG. 2, the same references are shown as in FIG. 1 to designate the same units, the configuration of these units being shown in detail, if need be, inside a dotted line rectangle delimiting each unit.

The amplifier for forming the signal is constituted by a differential amplifier whose gain can be varied by a set of negative feed back resistors which are selected by means of a selector 12, as a function of the type of weapon used and of the distance from which it will be fired.

The filter 5 is composed conventionally of one or several amplifiers 13, with two capacitors 14 in series, a feedback capacitor 15 and an adjustable feedback resistor 16 together with an adjustable resistor 17 connected to earth.

The multiplier 6 can simply be constituted firstly by a signal rectifier device comprising a diode 18 in parallel with a series connection of a diode 21 and an amplifier 19, whose gain is set to unity, by means of resistors 20, secondly by a non-linear device comprising a potential divider 22 constituted by different resistors such as R1, R2, R3, and R5 in series with one another and in parallel with diodes such as D1, D2, D3, D4 and by an amplifier 23 with a feedback resistor R.

The integrator 7 is composed of an operational amplifier 24 with a feedback capacitor 25 in parallel with a field effect transistor 26.

The comparison voltage of the threshold device 8 is supplied by a potentiometer 27. The output of the threshold device 8 is connected to the counter 9 by means of an AND gate 28 and a monostable flip-flop 29 whose holding time can be for example of the order of one millisecond.

The integration time of the integrator 7 is determined by the monostable circuit or flip-flop 10 whose holding time is for example 50 milliseconds and which controls am amplifier 30 which delivers an output signal capable of blocking the transistor 26 or of making it conductive.

The starting point of the integration is defined by a threshold device or comparator 11 which receives a reference voltage from a potentiometer 31 and detects the peaks of the signal supplied by the amplifier 3 or at the output of the filter 5, or at the output of the multiplier 6. Thus, when a vibration of the target occurs under the effect of an impact, the first peak of the electric signal generated is detected and this detection trips the flip-flop 10 via a signal lead 32 and consequently releases the integrator 7 during the holding time chosen for the monostable flip-flop 10.

Means have been added to this system which make it possible to avoid it counting as impacts the vibrations to which the target 40 may be subjected when it is raised or lowered (shocks against the support frame for example). The AND gate 28 then blocks the counting system due to a logic signal supplied by a connection 33. This signal comes from a monostable 34 which controls the closing of the gate 28 during a determined period (which can be approximately the same as the time for damping the vibrations of the target which result from a shock). The monostable 34 is energized by a signal generated on a connection 35 and which determines the instants when it is required to inhibit the detection device. FIG. 2 shows a particular use of this device in order to avoid taking into account the shocks to which an automatic tilting target 40 is subjected during the ends of travel. End of travel contacts 36 are opened or closed according to the position of the target and cause variations in the signal on the connection 35 which makes the monostable 34 assume its unstable position.

The impact detection signal which is constituted by a calibrated pulse which appears after each impact can be used for various functions; either for incrementing the counter 9 or for any other use. It is available on a connection 37.

What is claimed is:

1. A device for detecting a quantity of energy striking a solid body, the device comprising at least one sensor transforming the mechanical vibrations to which the body is subjected into an electrical signal and, in series, an amplifier receiving said signal, a high-pass filter, a multiplier, an integrator, a threshold detector and a monostable pulse shaping circuit, and said device further comprises a threshold device for detecting the peaks of said electrical signal a monostable flip flop connected to said threshold device and triggered thereby and connected to said integrator, such that the monostable flip flop logic output signal effects operation of said integrator.

2. A device for detecting energy according to claim 1, wherein the input of the threshold device is connected to the output of the amplifier.

3. A device for detecting energy according to claim 1, wherein said body is an impact-receiving target.

4. A device for detecting energy according to claim 3, further including a logic gate and a monostable flip flop connected to block the impact indicating output signals of the device whenever the target is liable to vibrate for reasons other than impacts.

5. A device according to claim 3, wherein the target is made of plywood and the low cut off frequency of the high-pass filter is about 10 kHz.

6. A device according to claim 1, further comprising means for adjusting the monostable period of the monostable flip flop which effects operation of said integrator to match the vibration damping time of the body.

* * * * *